United States Patent
Ko et al.

(10) Patent No.: US 12,310,157 B2
(45) Date of Patent: May 20, 2025

(54) TRANSPARENT DISPLAY DEVICE AND TILED DISPLAY DEVICE INCLUDING THE SAME

(71) Applicant: Samsung Display Co., Ltd., Yongin-si (KR)

(72) Inventors: Yoo Min Ko, Suwon-si (KR); Gun Hee Kim, Seoul (KR); Hye Won Kim, Seoul (KR); Sun Hee Lee, Hwaseong-si (KR); Joo Hee Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 585 days.

(21) Appl. No.: 17/483,727

(22) Filed: Sep. 23, 2021

(65) Prior Publication Data

US 2022/0199874 A1  Jun. 23, 2022

(30) Foreign Application Priority Data

Dec. 21, 2020 (KR) .................. 10-2020-0179716

(51) Int. Cl.
| | |
|---|---|
| *H10H 20/857* | (2025.01) |
| *G09F 9/302* | (2006.01) |
| *G09F 9/33* | (2006.01) |
| *G09G 3/32* | (2016.01) |
| *H10H 29/14* | (2025.01) |

(52) U.S. Cl.
CPC ......... *H10H 20/857* (2025.01); *G09F 9/3026* (2013.01); *G09F 9/33* (2013.01); *G09G 3/32* (2013.01); *H10H 29/142* (2025.01)

(58) Field of Classification Search
None
See application file for complete search history.

(56) References Cited

U.S. PATENT DOCUMENTS

| | | |
|---|---|---|
| 8,508,438 B2 | 8/2013 | Suh |
| 10,147,777 B2 | 12/2018 | Lim et al. |
| 10,191,711 B2 | 1/2019 | Choi et al. |
| 10,768,883 B2 | 9/2020 | Jeong |

(Continued)

FOREIGN PATENT DOCUMENTS

| | | |
|---|---|---|
| KR | 10-0922069 | 10/2009 |
| KR | 10-2015-0111808 | 10/2015 |

(Continued)

*Primary Examiner* — Alexander G Ghyka
(74) *Attorney, Agent, or Firm* — KILE PARK REED & HOUTTEMAN PLLC

(57) ABSTRACT

A transparent display device includes a substrate, a main light emitting diode, a main transmission region, a sub-light emitting diode, a sub-transmission region, and a driving circuit. The substrate includes a main display area and a peripheral area adjacent to the main display area. The main light emitting diode is disposed in the main display area. The main transmission region is disposed in the main display area and adjacent to the main light emitting diode. The sub-light emitting diode is disposed in the peripheral area. The sub-transmission region is disposed in the peripheral area and adjacent to the sub-light emitting diode. The driving circuit is disposed in the peripheral area and overlaps, in a plan view, the sub-light emitting diode.

11 Claims, 16 Drawing Sheets

(56) References Cited

U.S. PATENT DOCUMENTS

| | | | |
|---|---|---|---|
| 11,189,669 | B2 | 11/2021 | Kim et al. |
| 2009/0147177 | A1 | 6/2009 | Lee et al. |
| 2018/0145118 | A1* | 5/2018 | Kim ..................... H10K 71/00 |
| 2019/0198575 | A1 | 6/2019 | Liu et al. |

FOREIGN PATENT DOCUMENTS

| | | |
|---|---|---|
| KR | 10-2017-0015773 | 2/2017 |
| KR | 10-2017-0074299 | 6/2017 |
| KR | 10-2018-0018960 | 2/2018 |
| KR | 10-2018-0056446 | 5/2018 |

* cited by examiner

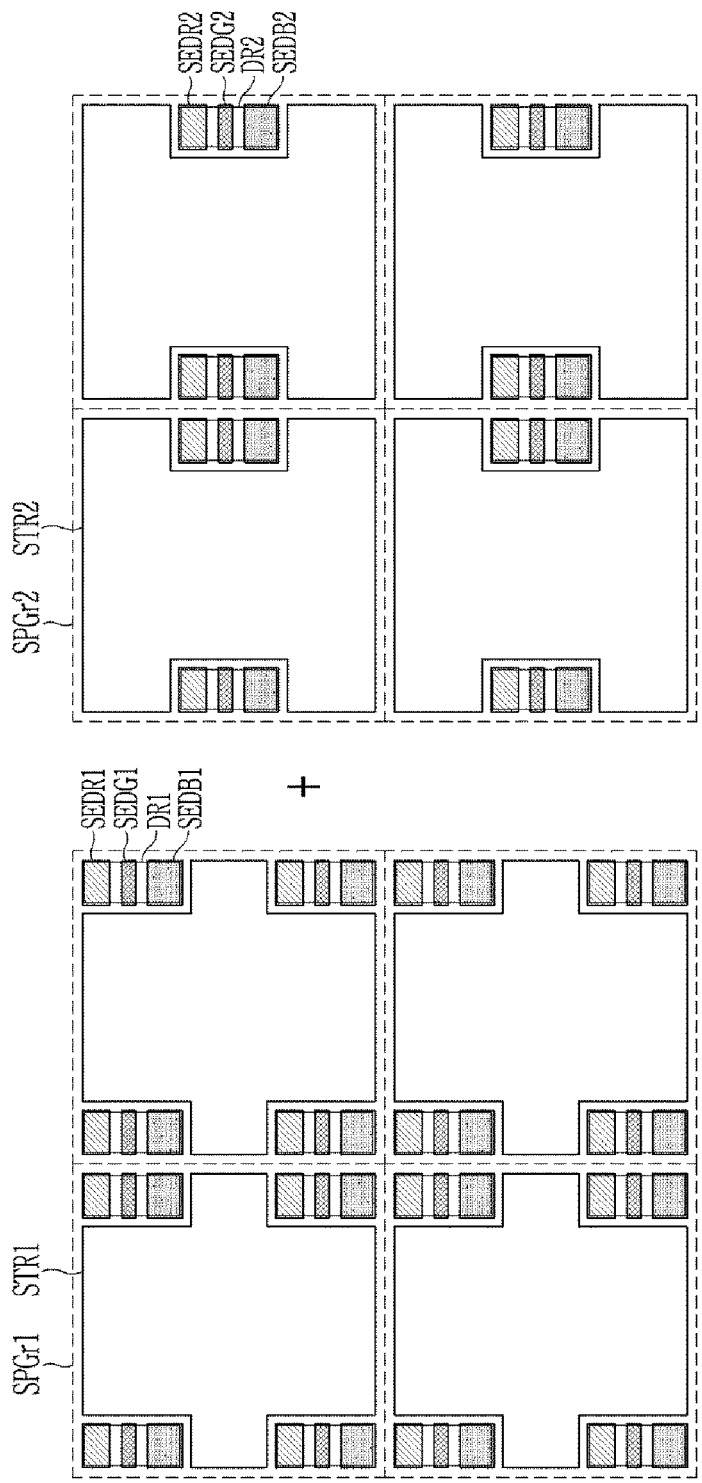

TRANSPARENT DISPLAY DEVICE AND TILED DISPLAY DEVICE INCLUDING THE SAME

CROSS-REFERENCE TO RELATED APPLICATIONS

This application claims priority to and the benefit of Korean Patent Application No. 10-2020-0179716, filed Dec. 21, 2020, which is hereby incorporated by reference for all purposes as if fully set forth herein.

BACKGROUND

Field

One or more embodiments generally to a transparent display device and a tiled display device including the same.

Discussion

A display device is a device configured to display an image on a screen, and may include, for instance, a liquid crystal display (LCD), an organic light emitting diode (OLED) display, and the like. Such display devices are used in various electronic devices, such as portable telephones, navigation systems, digital cameras, electronic books, portable game devices, various terminals, etc.

The display device may include a display area in which a screen is displayed and a peripheral area in which the screen is not displayed. A plurality of pixels may be disposed in the display area in a row direction and a column direction. Within each pixel, various devices such as transistors and capacitors and various wires that can supply signals to these devices can be disposed. Various wires, scan drivers, data drivers, controllers, and the like that transmit electrical signals to drive these pixels can be disposed in the peripheral area.

Although the demand to reduce the size of the peripheral area and enlarge the display area is increasing, it is difficult to reduce the size of the peripheral area at least because the area occupied by the driver is increasing in the process of implementing high resolution and high-speed driving.

The above information disclosed in this section is only for understanding the background of the inventive concepts, and, therefore, may contain information that does not form prior art.

SUMMARY

One or more embodiments are capable of providing a transparent display device of which a display area is expanded.

One or more embodiments are capable of providing a tiled display device including a transparent display device of which a display area is expanded.

Additional aspects will be set forth in the detailed description which follows, and, in part, will be apparent from the disclosure, or may be learned by practice of the inventive concepts.

According to an embodiment, a transparent display device includes a substrate, a main light emitting diode, a main transmission region, a sub-light emitting diode, a sub-transmission region, and a driving circuit. The substrate includes a main display area and a peripheral area adjacent to the main display area. The main light emitting diode is disposed in the main display area. The main transmission region is disposed in the main display area and adjacent to the main light emitting diode. The sub-light emitting diode is disposed in the peripheral area. The sub-transmission region is disposed in the peripheral area and adjacent to the sub-light emitting diode. The driving circuit is disposed in the peripheral area and overlaps, in a plan view, the sub-light emitting diode.

According to an embodiment, a tiled display device includes a first display panel and a second display panel at least partially overlapped with each other in a plan view. Each of the first display panel and the second display panel includes a substrate, a main light emitting diode, a main transmission region, a sub-light emitting diode, a sub-transmission region, and a driving circuit. The substrate includes a main display area and a peripheral area adjacent to the main display area. The main light emitting diode is disposed in the main display area. The main transmission region is disposed in the main display area and adjacent to the main light emitting diode. The sub-light emitting diode is disposed in the peripheral area. The sub-transmission region is disposed in the peripheral area and adjacent to the sub-light emitting diode. The driving circuit is disposed in the peripheral area and overlaps, in the plan view, the sub-light emitting diode.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

FIGS. 14, 15, and 16 are schematic top plan views of a part of the display device of FIG. 8 according to some embodiments.

DETAILED DESCRIPTION OF SOME EMBODIMENTS

Figure 1:
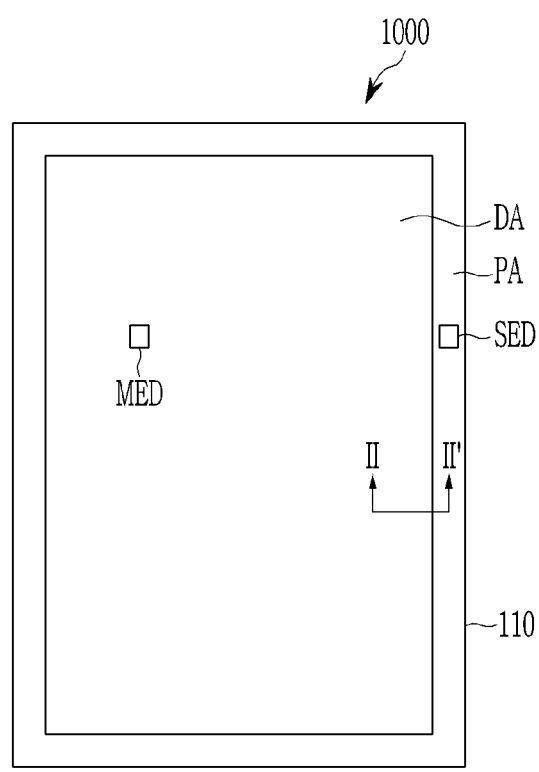
FIG. 1 is a schematic top plan view of a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various is embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, throughout the specification, the word "on" a target element will be understood to mean positioned above or below the target element, and will not necessarily be understood to mean positioned "at an upper side" based on an opposite to gravity direction. In addition, throughout the specification, the phrase "on a plane" means viewing a target portion from the top, and the phrase "on a cross-section" means viewing a cross-section formed by vertically cutting a target portion from the side. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/of" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

First, referring to FIGS. 1 and 2, a display device according to an embodiment will be described.

Figure 2:
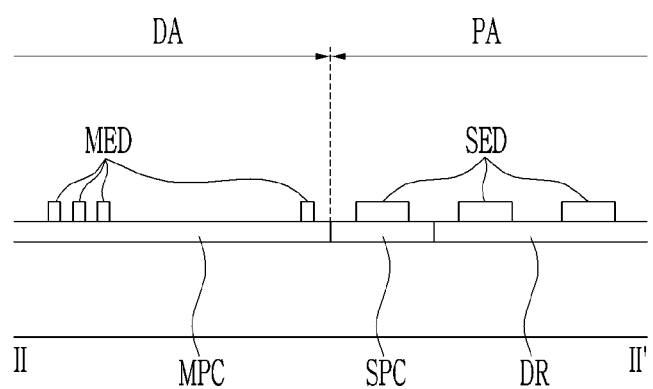
FIG. 2 is a schematic cross-sectional view of FIG. 1 taken along sectional line II-II' according to an embodiment.

FIG. 1 is a schematic top plan view of a display device according to an embodiment. FIG. 2 is a cross-sectional view of FIG. 1 taken along sectional line II-II' according to an embodiment.

As shown in FIG. 1, a display device 1000 according to an embodiment includes a substrate 110 and light emitting diodes MWD and SED disposed on the substrate 110.

The substrate 110 includes a main display area DA, and a peripheral area PA that is adjacent to (e.g., outside) the main display area DA.

The main display area DA may be disposed at a center (or central) portion of the display device 1000, and may be formed in the shape of a quadrangle, approximately. However, the shape of the main display area DA is not limited thereto, and may be variously modified.

The peripheral area PA may have a shape that surrounds the main display area DA. For instance, the peripheral area PA may be disposed in (or about) an outer edge portion of the display device 1000.

The main light emitting diodes MED and SED may emit predetermined light. For example, the main light emitting diodes MED and SED may emit light of at least one of red, green, blue, and white light. The display device 1000 may display an image through light emitted from the main light emitting diodes MED and SED. The main light emitting diodes MED and SED may include a main light emitting diode MED and a sub-main light emitting diode SED. The main light emitting diode MED may be disposed in the main display area DA, and the sub-main light emitting diode SED may be disposed in the peripheral area PA. In some embodiments, the display device 1000 may include a plurality of main light emitting diodes MED and a plurality of sub-main light emitting diodes SED. The plurality of main light emitting diodes MED may be arranged along a row direction and a column direction in the main display area DA, and the plurality of sub-main light emitting diodes SED may be arranged in a row direction and a column direction in the peripheral area PA. The main light emitting diode MED and the sub-main light emitting diode SED may be the same as or different from each other in size. For example, the sub-main light emitting diode SED may be larger than the main light emitting diode MED. The number of main light emitting diodes MWD per unit area and the number of sub-main light emitting diodes SED per unit area may be the same as or different from each other. For example, the number of sub-main light emitting diodes SED per unit area may be smaller than the number of main light emitting diodes MWD per unit area. The resolution of the main display area DA and the resolution of the peripheral area PA may be the same as or different from each other. For example, the resolution of the main display area DA may be higher than the resolution of the peripheral area PA. The arrangement form, size, and resolution of the main display area DA and the peripheral area PA are not limited thereto, and various changes are contemplated.

The display device 1000 according to some embodiments may further include pixel circuits MPC and SPC disposed on the substrate 110. The pixel circuits MPC and SPC may include a main pixel circuit MPC and a sub-pixel circuit SPC. The display device 1000 according to some embodiments may include a plurality of main pixel circuits MPC and a plurality of sub-pixel circuits SPC. As seen in FIG. 2, the main pixel circuit MPC substantially indicates an area where the plurality of main pixel circuits MPC are arranged in a row direction and a column direction, and the sub-pixel circuit SPC substantially indicates an area where the plurality of sub-pixel circuits SPC are arranged in a row direction and a column direction. The arrangement form of the plurality of pixel circuits MPC and SPC is not particularly limited, and may be arranged in various forms. The main pixel circuit MPC may be disposed in the main display area DA, and the sub-pixel circuit SPC may be disposed in the peripheral area PA. Each of the pixel circuits MPC and SPC may be connected to one of the main light emitting diodes MED and SED. The main pixel circuit MPC may be connected to the main light emitting diode MED, and the sub-pixel circuit SPC may be connected to the sub-main light emitting diode SED. The size of one main pixel circuit MPC and the size of one sub-pixel circuit SPC may be the same or different. For example, the size of one sub-pixel circuit SPC may be larger than the size of one main pixel circuit MPC.

The display device 1000 according to some embodiments may further include a driving circuit DR disposed on the substrate 110. The driving circuit DR may include a plurality of drivers and signal wires. For example, the driving circuit DR may include a scan driver, a data driver, a driving voltage supply line, a common voltage supply line, and signal transmission wires connected thereto. The scan driver generates a scan signal and transmits the scan signal to the pixel circuits MPC and SPC through scan lines. The data driver generates a data signal and transmits the data signal to the pixel circuits MPC and SPC through data lines. The driving voltage supply line transmits a driving voltage to the pixel circuits MPC and SPC. The common voltage supply line transmits a common voltage to an electrode of the main light emitting diodes MWD and SED. The driving circuit DR may be disposed in the peripheral area PA. The driving circuit DR may not overlap the sub-pixel circuit SPC. The sub-pixel circuit SPC may be disposed between the driving circuit DR and the main pixel circuit MPC.

In the main display area DA, the main pixel circuit MPC may be connected to the main light emitting diode MED, which is disposed on the main pixel circuit MPC. In this case, a light emitting area of the main light emitting diode MED may overlap the main pixel circuit MPC connected with the main pixel circuit MPC. The main display area DA is an area where light is emitted by the main light emitting diode MED.

In the peripheral area PA, the sub-pixel circuit SPC may be connected to the sub-main light emitting diode SED that is distanced therefrom with a predetermined interval. In this case, a light emitting area of the sub-main light emitting diode SED may not overlap the sub-pixel circuit SPC connected thereto. The light emitting area of the sub-main light emitting diode SED may overlap a sub-pixel circuit SPC that is not connected thereto, and may overlap the driving circuit DR. Light emitting areas of some of the sub-main light emitting diodes SED may overlap sub-pixel circuits SPC connected thereto. The peripheral area PA is an area where light is emitted by the sub-main light emitting diode SED.

In a general display device, a pixel circuit and a main light emitting diode are disposed in a display area, a driving circuit is disposed in a peripheral area that surrounds the display area, and the pixel circuit and the main light emitting diode are not disposed in the peripheral area. Thus, light is not emitted from the peripheral area where the driving circuit is disposed, and a dead space (e.g., bezel area) is formed. In the display device 1000 according to some embodiments, the sub-main light emitting diode SED is disposed in the peripheral area PA, and thus, light is emitted, and accordingly, an area where the screen is displayed can be expanded. For instance, since the sub-main light emitting diode SED is disposed on the driving circuit DR, a dead space can be reduced, and in this manner, a bezel area can be reduced.

The display device 1000 according to some embodiments may be formed as a transparent display device. Thus, the display device 1000 according to some embodiments may include a transmission area. Hereinafter, referring to FIGS. 3 to 6, the transmission region of the display device according to some embodiments, the arrangement form of the main light emitting diode, and the connection relationship between each pixel circuit and the light emitting diode will be described in more detail.

Figure 3:
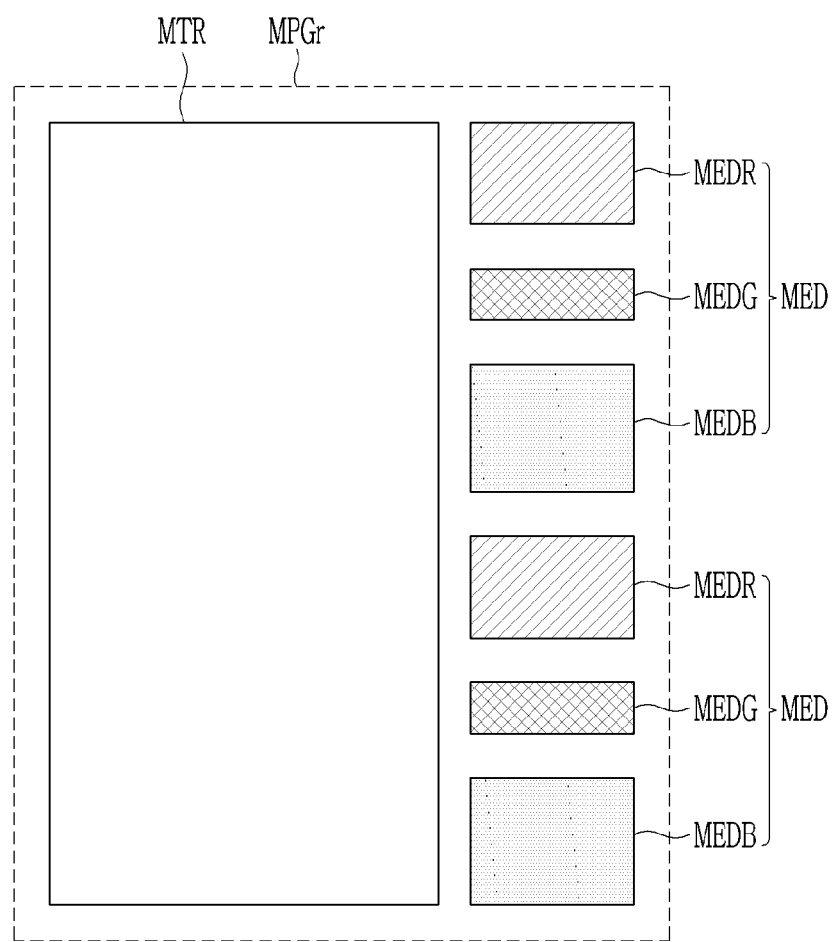
FIG. 3 is a schematic top plan view of a part of a main display area of the display device of FIG. 1 according to an embodiment.
Figure 4:
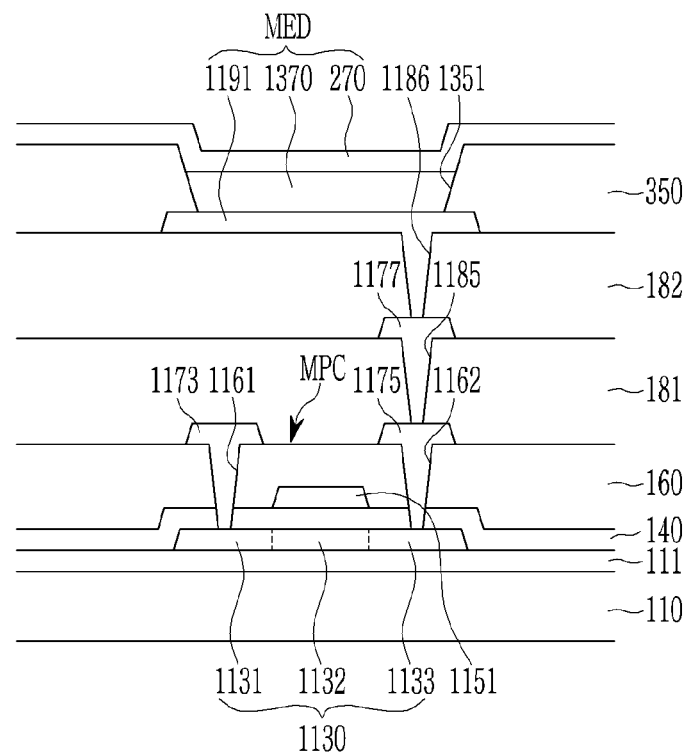
FIG. 4 is a schematic cross-sectional view of a main display area of the display device of FIG. 1 according to an embodiment.
Figure 5:
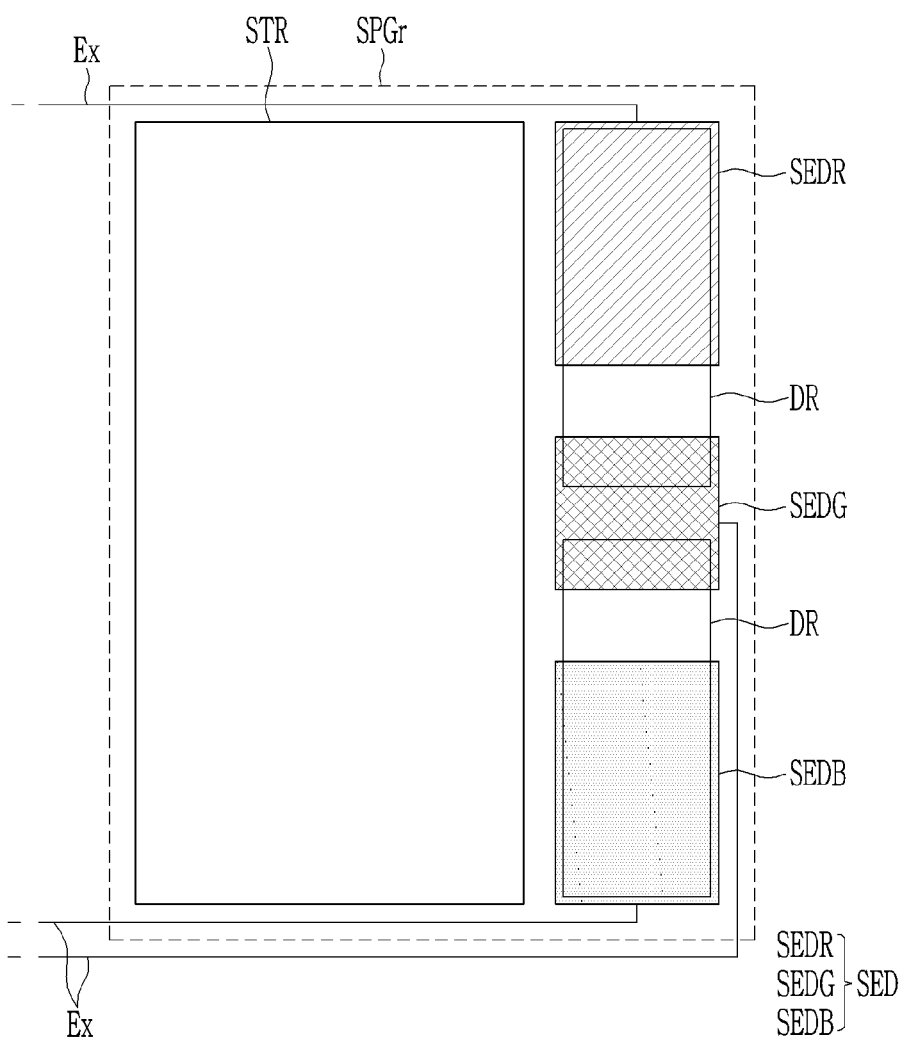
FIG. 5 is a schematic top plan view of a part of a peripheral area of the display device of FIG. 1 according to an embodiment.
Figure 6:
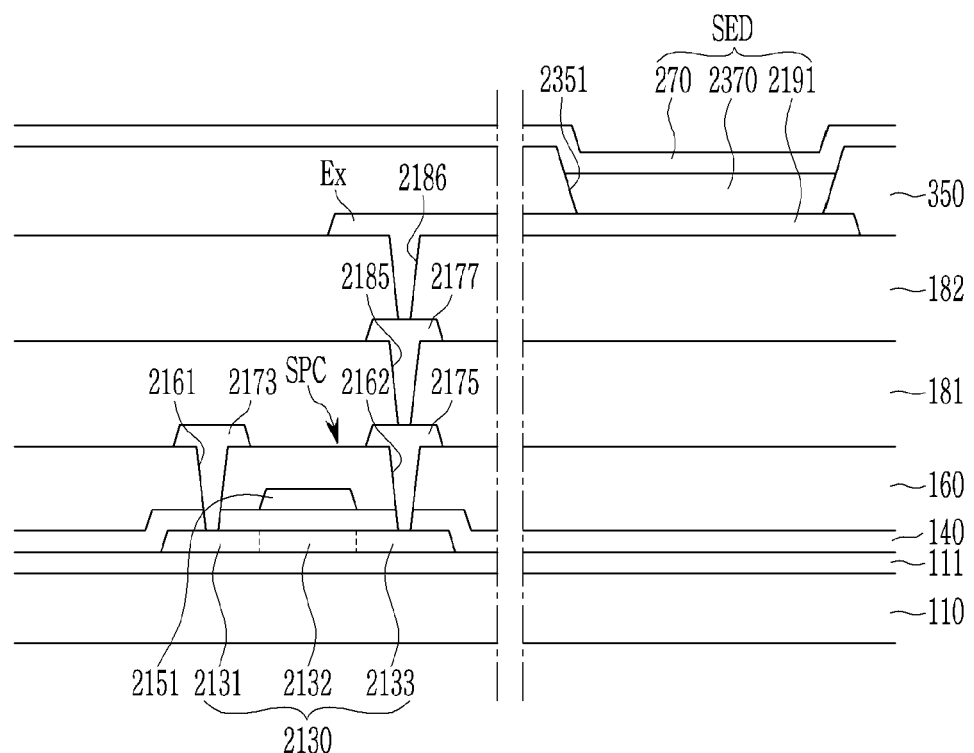
FIG. 6 is a schematic cross-sectional view of a peripheral area of the display device of FIG. 1 according to an embodiment.

FIG. 3 is a schematic top plan view of a part of a main display area of the display device of FIG. 1 according to an embodiment. FIG. 4 is a schematic cross-sectional view of a main display area of the display device of FIG. 1 according to an embodiment. FIG. 5 is a schematic top plan view of a part of a peripheral area of the display device of FIG. 1 according to an embodiment. FIG. 6 is a schematic cross-sectional view of a peripheral area of the display device of FIG. 1 according to an embodiment.

First, as shown in FIG. 3, a main pixel group MPGr may be disposed in the main display area DA of the display device according to some embodiments. A plurality of main pixel groups MPGr may be arranged along a row direction and a column direction in the main display area DA.

Each main pixel group MPGr may include a plurality of main light emitting diodes MED and one main transmission region MTR. However, this is not restrictive, and the number of main light emitting diodes MED and main transmission regions MTR constituting the main pixel group MPGr may be variously changed. For example, each main pixel group MPGr may include one main light emitting diode MED and one main transmission region MTR. As another example, each main pixel group MPGr may include a plurality of main light emitting diodes MED and a plurality of main transmission regions MTR.

Each main pixel group MPGr may include six main light emitting diodes MED. For example, one main pixel group MPGr may include two first color main light emitting diodes MEDR, two second color main light emitting diodes MEDG, and two third color main light emitting diodes MEDB. The first color main light emitting diode MEDR may display red, the second color main light emitting diode MEDG may display green, and the third color main light emitting diode MEDB may display blue. However, this is only an example, and the color of light indicated by each main light emitting diode MWD may be variously changed. The main transmission region MTR may be disposed in the left region of the main pixel group MPGr, and the first color main light emitting diode MEDR, the second color main light emitting diode MEDG, and the third color main light emitting diode MEDB may be alternately arranged in a column direction in the right region. The size of the main transmission region MTR may be larger than the entire size of the six main light emitting diodes MED. However, this is not restrictive, and the arrangement shape and size of the main transmission region MTR, the first color main light emitting diode MEDR, the second color main light emitting diode MEDG, and the third color main light emitting diode MEDB can be variously changed.

As shown in FIG. 4, the light emitting region of the main light emitting diode MED of the display device 1000 according to some embodiments overlaps the main pixel circuit MPC connected with the main light emitting diode MED.

The main pixel circuit MPC may include a semiconductor 1130, a gate electrode 1151, a source electrode 1173, and a drain electrode 1175, each of which is disposed on the substrate 110.

The substrate 110 may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material that can be bent, folded, twisted, or the like, and may be single-layered or multi-layered.

A buffer layer 111 may be disposed on the substrate 110. The buffer layer 111 may have a single-layer or multi-layer structure. The buffer layer 111 may include an inorganic insulating material, such as at least one of a silicon nitride (SiNx), a silicon oxide (SiOx), a silicon oxynitride (SiOxNy), and an organic insulating material. The buffer layer 111 may be omitted. In addition, a barrier layer may be disposed between the substrate 110 and the buffer layer 111. The barrier layer may have a single layer or multi-layer structure. The barrier layer may include an inorganic insulating material, such as at least one of a silicon nitride (SiNx), a silicon oxide (SiOx), a silicon oxynitride (SiOxNy), and an organic insulating material.

A semiconductor layer that includes a semiconductor 1130 of the main pixel circuit MPC may be disposed on the buffer layer 111. The semiconductor 1130 may include a first region 1131, a channel 1132, and a second region 1133. The first region 1131 and the second region 1133 may be disposed at opposite sides of the channel 1132 of the semiconductor 1130 of the main pixel circuit MPC. The semiconductor 1130 of the main pixel circuit MPC may include a semiconductor material, such as amorphous silicon, polysilicon, an oxide semiconductor, and/or the like.

A gate insulating layer 140 may be disposed on the semiconductor 1130 of the main pixel circuit MPC. The gate insulating layer 140 may have a single layer or multi-layer structure. The gate insulating layer 140 may include an inorganic insulating material, such as at least one of a silicon nitride (SiNx), a silicon oxide (SiOx), and a silicon oxynitride (SiOxNy).

A gate conductive layer that includes a gate electrode 1151 and the like of the main pixel circuit MPC may be disposed on the gate insulating layer 140. The gate electrode 1151 of the main pixel circuit MPC may overlap the channel 1132 of the semiconductor 1130. The gate conductive layer may have a single-layered or multi-layer structure. The gate conductive layer may include a metallic material, such as molybdenum (Mo), aluminum (Al), copper (Cu), and/or titanium (Ti). After forming the gate conductive layer, a doping process or a plasma treatment can be performed. A part of the semiconductor layer that is covered by the gate conductive layer is not doped or does not undergo the plasma treatment, and a part of the semiconductor layer that is not covered by the gate conductive layer is doped or undergoes the plasma treatment, and thus, it may have the same characteristic as a conductor.

An interlayer insulating layer 160 may be disposed on the gate electrode 1151 of the main pixel circuit MPC. The interlayer insulating layer 160 may have a single-layer or multi-layer structure. The interlayer insulating layer 160 may include at least one of an inorganic insulating material and an organic insulating material.

A first data conductive layer that includes a source electrode 1173 and a drain electrode 1175 of the main pixel circuit MPC may be disposed on the interlayer insulating layer 160. The first data conductive layer may include aluminum (Al), platinum (Pt), palladium (Pd), silver (Ag), magnesium (Mg), gold (Au), nickel (Ni), neodymium Nd, iridium (Ir), chromium (Cr), nickel (Ni), calcium (Ca), molybdenum (Mo), titanium (Ti), tungsten (W), and/or copper (Cu).

The interlayer insulating layer 160 may include an opening 1161 that overlaps the source electrode 1173 of the main pixel circuit MPC and the first region 1131 of the semiconductor 1130. The source electrode 1173 of the main pixel circuit MPC may be connected to the first region 1131 of the semiconductor 1130 through the opening 1161. The interlayer insulating layer 160 may include an opening 1162 that overlaps the drain electrode 1175 of the main pixel circuit MPC and the second region 1133 of the semiconductor 1130. The drain electrode 1175 of the main pixel circuit MPC may be connected to the second region 1133 of the semiconductor 1130 through the opening 1162.

A first protective layer 181 and a second protective layer 182 may be sequentially disposed on the source electrode 1173 and the drain electrode 1175 of the main pixel circuit MPC. The first protective layer 181 and the second protective layer 182 may include at least one of general-purpose polymers, such as poly(methyl methacrylate) (PMMA) or polystyrene (PS), polymer derivatives having phenolic groups, and an organic insulating material acryl-based polymers, imide polymers, polyimide, an acryl-based polymer, and a siloxane-based polymer.

A second data conductive layer that includes a connection electrode 1177 may be disposed between the first protective layer 181 and the second protective layer 182. The first protective layer 181 may include an opening 1185 that overlaps the connection electrode 1177 and the drain electrode 1175. The connection electrode 1177 may be connected to the drain electrode 1175 through the opening 1185.

A main light emitting diode MED that is connected to the main pixel circuit MPC may be disposed on the second protective layer 182. The main light emitting diode MWD may include a pixel electrode 1191, a light emitting diode layer 1370, and a common electrode 270.

The pixel electrode 1191 of the main light emitting diode MED may be disposed on the second protective layer 182. The second protective layer 182 may include an opening 1186 that overlaps the pixel electrode 1191 and the connection electrode 1177. The pixel electrode 1191 of the main light emitting diode MED may be connected to the connection electrode 1177 through the opening 1186. The connection electrode 1177 may connect the drain electrode 1175 and the pixel electrode 1191. However, embodiments are not limited thereto, and the drain electrode 1175 and the pixel electrode 1191 may be directly connected without a connection electrode in some embodiments.

A partitioning wall 350 may be disposed on the pixel electrode 1191 of the main light emitting diode MED. A pixel opening 1351 may be formed in the partitioning wall 350, and the pixel opening 1351 of the partitioning wall 350 may overlap the pixel electrode 1191.

The light emitting diode layer 1370 of the main light emitting diode MED may be disposed in the pixel opening 1351 of the partitioning wall 350. The light emitting diode layer 1370 may overlap the pixel electrode 1191.

A common electrode 270 may be disposed on the light emitting diode layer 1370 and the partitioning wall 350.

The main light emitting diode MED emits light around a region where the pixel electrode 1191, the light emitting diode layer 1370, and the common electrode 270 overlap, and the light emitting region of the main light emitting diode MED may overlap with the main pixel circuit MPC connected thereto.

The main light emitting diode MED and the main pixel circuit MPC may not be disposed in the main transmission region MTR. The main transmission region MTR is a transparent region, and is a region through which external light can be transmitted. The main display area DA of the display device 1000 according to some embodiments can be transparently recognized by the main transmission region MTR. The semiconductor layer, the gate conductive layer, the first data conductive layer, the second data conductive layer, the pixel electrode 1191, the light emitting diode layer 1370, and the common electrode 270 may not be disposed in the main transmission region MTR. Depending on cases, some of the semiconductor layer, the gate conductive layer, the first data conductive layer, the second data conductive layer, the pixel electrode 1191, the light emitting diode layer 1370, and the common electrode 270 may be disposed in the main transmission region MTR. Some of the buffer layer 111, the gate insulating layer 140, the interlayer insulating layer 160, the first protective layer 181, the second protective layer 182, and the partitioning wall 350 may not be disposed in the main transmission region MTR. As the number of layers disposed on the main transmission region MTR is minimized, the transparency of the display device 1000 according to some embodiments can be increased.

Next, as shown in FIG. 5, a sub-pixel group SPGr may be disposed in the peripheral area PA of the display device 1000 according to some embodiments. A plurality of sub-pixel groups SPGr may be arranged along a row direction and a column direction in the peripheral area PA.

Each of the sub-pixel groups SPGr may include a plurality of sub-main light emitting diodes SED and one sub-transmission region STR. However, embodiments are not limited thereto, and the number of sub-main light emitting diodes SED and sub-transmission regions STR constituting the sub-pixel group SPGr may be variously changed. For example, each sub-pixel group SPGr may include one sub-main light emitting diode SED and one sub-transmission region STR. As another example, each sub-pixel group SPGr may include a plurality of sub-main light emitting diodes SED and a plurality of sub-transmission regions STR.

Each sub-pixel group SPGr may include three sub-main light emitting diodes SED. For example, one sub-pixel group SPGr may include one first color sub-light emitting diode SEDR, one second color sub-light emitting diode SEDG, and one third color sub-light emitting diode SEDB. The first color sub-light emitting diode SEDR may display red, the second color sub-light emitting diode SEDG may display green, and the third color sub-light emitting diode SEDB may display blue. However, this is only an example, and the color of light indicated by each sub-main light emitting diode SED may be variously changed. The sub-transmission region STR may be disposed in the left region of the sub-pixel group SPGr, and the first color sub-light emitting diode SEDR, the second color sub-light emitting diode SEDG, and the third color sub-light emitting diode SEDB may be alternately arranged along a column direction in the right region. The size of the sub-transmission region STR may be larger than the entire size of the three sub-main light emitting diodes SED. However, embodiments are not limited thereto, and the arrangement shape and size of the sub-transmission region STR, the first color sub-light emitting diode SEDR, the second color sub-light emitting diode SEDG, and the third color sub-light emitting diode SEDB may be variously changed.

A driving circuit DR may be disposed in the peripheral area PA of the display device 1000 according to some embodiments. The driving circuit DR may overlap the sub-main light emitting diode SED. One sub-pixel group SPGr may overlap two driving circuits DR. For example, the first color sub-light emitting diode SEDR may overlap one of the two driving circuits DR, the third color sub-light emitting diode SEDB may overlap the other one of the two driving circuits DR, and the second color sub-light emitting diode SEDG may overlap edges of the two driving circuits DR and a region between the two driving circuits DR. However, this is only an example, and the overlapping relationship between the driving circuit DR and the sub-main light emitting diode SED may be variously changed.

In the peripheral area PA, the sub-main light emitting diode SED may be connected to the sub-pixel circuit SPC that is distanced by a predetermined interval. In this case, the sub-main light emitting diode SED may include an anode, an emission layer, and a cathode that are sequentially stacked, and extends from the anode, and thus, may be connected to the sub-pixel circuit SPC by an extension line Ex. In this case, the extension line Ex can be bypassed so as not to pass the sub-transmission region STR. For instance, the extension line Ex may be disposed above or below the sub-transmission region STR on a plane without overlapping with the sub-transmission region STR. For example, the extension line Ex extending from the first color sub-light emitting diode SEDR may pass above the sub-transmission region STR. The extension line Ex, which is extended from the second color sub-light emitting diode SEDG and the third color sub-light emitting diode SEDB, may pass below the sub-transmission region STR. However, this is only an example, and the position of the extension line Ex may be variously changed.

As shown in FIG. 6, the light emitting region of the sub-main light emitting diode SED of the display device 1000 according to some embodiments may not overlap a sub-pixel circuit SPC connected with the sub-main light emitting diode SED. In FIG. 6, the driving circuit DR is not illustrated, and the sub-main light emitting diode SED may overlap the driving circuit DR.

The sub-pixel circuit SPC may include a semiconductor 2130, a gate electrode 2151, a source electrode 2173, and a drain electrode 2175, each of which is disposed on the substrate 110.

A buffer layer 111 may be disposed on the substrate 110, and the semiconductor 2130 of the sub-pixel circuit SPC may be disposed on the buffer layer 111. The semiconductor 2130 of the sub-pixel circuit SPC may be disposed in a semiconductor layer.

The gate insulating layer 140 may be disposed on the semiconductor 2130 of the sub-pixel circuit SPC, and a gate electrode 2151 of the sub-pixel circuit SPC may be positioned on the gate electrode insulating layer 140. The gate electrode 2151 of the sub-pixel circuit SPC may be disposed in the gate conductive layer. The gate electrode 2151 of the sub-pixel circuit SPC may overlap a channel 2132 of the semiconductor 2130.

An interlayer insulating layer 160 may be disposed on the gate electrode 2151 of the sub-pixel circuit SPC, and a source electrode 2173 and a drain electrode 2175 of the sub-pixel circuit SPC may be disposed on the interlayer insulating layer 160. The source electrode 2173 and the drain electrode 2175 of the sub-pixel circuit SPC may be disposed in the first data conductive layer.

The interlayer insulating layer 160 may include an opening 2161 that overlaps the source electrode 2173 of the sub-pixel circuit SPC and a first region 2131 of the semiconductor 2130. The source electrode 2173 of the sub-pixel circuit SPC may be connected to the first region 2131 of the semiconductor 2130 through the opening 2161. The interlayer insulating layer 160 may include an opening 2162 that overlaps the drain electrode 2175 of the sub-pixel circuit SPC and a second region 2133 of the semiconductor 2130. The drain electrode 2175 of the sub-pixel circuit SPC may be connected to a second region 2133 of the semiconductor 2130 through the opening 2162.

A first protective layer 181 and a second protective layer 182 may be sequentially stacked on the source electrode 2173 and the drain electrode 2175 of the sub-pixel circuit SPC. A connection electrode 2177 may be disposed between the first protective layer 181 and the second protective layer 182. The connection electrode 2177 of the sub-pixel circuit SPC may be disposed in the second data conductive layer. The first protective layer 181 may include an opening 2185 that overlaps the connection electrode 2177 and the drain electrode 2175. The connection electrode 2177 may be connected to the drain electrode 2175 through the opening 2185.

The sub-main light emitting diode SED connected with the sub-pixel circuit SPC may be disposed on the second protective layer 182. The sub-main light emitting diode SED may include a pixel electrode 2191, a main light emitting diode layer 2370, and a common electrode 270.

The pixel electrode 2191 of the sub-main light emitting diode SED may be disposed on the second protective layer 182. The pixel electrode 2191 of the sub-main light emitting diode SED may include an extension line Ex. The second protective layer 182 may include an opening 2186 that overlaps the extension line Ex of the pixel electrode 2191 and the connection electrode 2177. The extension line Ex of the pixel electrode 2191 of the sub-main light emitting diode SED may be connected to the connection electrode 2177 through the opening 2186. The connection electrode 2177 may connect the drain electrode 2175 and the pixel electrode 2191. However, this is not restrictive, and the drain electrode 2175 and the pixel electrode 2191 may be directly connected without a connection electrode depending on some embodiments.

The partitioning wall 350 may be disposed on the pixel electrode 2191 of the sub-main light emitting diode SED. A pixel opening 2351 is formed in the partitioning wall 350, and the pixel opening 2351 of the partitioning wall 350 may overlap the pixel electrode 2191.

The main light emitting diode layer 2370 of the sub-main light emitting diode SED may be disposed in the pixel opening 2351 of the partitioning wall 350. The main light emitting diode layer 2370 may overlap the pixel electrode 2191.

The common electrode 270 may be disposed on the main light emitting diode layer 2370 and the partitioning wall 350. The common electrode 270 of the sub-main light emitting diode SED and the common electrode 270 of the main light emitting diode MED may be integrally formed, and may be disposed in most of the area on the substrate 110. However, the common electrode 270 may not be disposed in the main transmission region MTR and the sub-transmission region STR.

The sub-main light emitting diode SED emits light mainly in the area where the pixel electrode 2191, the main light emitting diode layer 2370, and the common electrode 270 overlap, and the light emitting region of the sub-main light emitting diode SED may not overlap a sub-pixel circuit SPC that is connected thereto. A length of the extension line Ex of the pixel electrode 2191 is longer as a distance between the sub-main light emitting diode SED and the sub-pixel circuit SPC increases.

The sub-main light emitting diode SED and the sub-pixel circuit SPC may not be disposed in the sub-transmission region STR. The sub-transmission region STR is a transparent region, and is a region through which external light can be transmitted. The peripheral area PA of the display device 1000 according to some embodiments can be transparently recognized in the sub-transmission region STR. The semiconductor layer, the gate conductive layer, the first data conductive layer, the second data conductive layer, the pixel electrode 2191, the main light emitting diode layer 2370, and the common electrode 270 may not be disposed in the sub-transmission region STR. Depending on cases, some of the semiconductor layer, the gate conductive layer, the first data conductive layer, the second data conductive layer, the pixel electrode 2191, the main light emitting diode layer 2370, and the common electrode 270 may be disposed in the sub-transmission region STR. Some of the buffer layer 111, the gate insulating layer 140, the interlayer insulating layer 160, the first protective layer 181, the second protective layer 182, and the partitioning wall 350 may not be disposed in the sub-transmission region STR. As the number of the layers disposed on the sub-transmission region STR is minimized, the transparency of the display device 1000 according to some embodiments can be increased.

In the display device 1000 according to some embodiments, since the peripheral area PA where the driving circuit DR is disposed includes the sub-transmission region STR, the peripheral area PA can be transparently recognized. For instance, the display device 1000 according to some embodiments can implement a transparent display device that is entirely (or substantially entirely) transparent. In addition, since the sub-main light emitting diode SED is disposed on the driving circuit DR in the peripheral area PA, the peripheral area PA can be transparent while emitting light. In this manner, a bezel area can be minimized (or at least reduced).

In the above, a connection relationship between one of the transistors included in each of the pixel circuits MPC and SPC and light emitting diodes MWD and SED has been described, but each of the pixel circuits MPC and SPC may include a plurality of transistors. Hereinafter, the plurality of transistors included in each of the pixel circuits MPC and SPC will be described in more detail with reference to FIG. 7.

Figure 7:
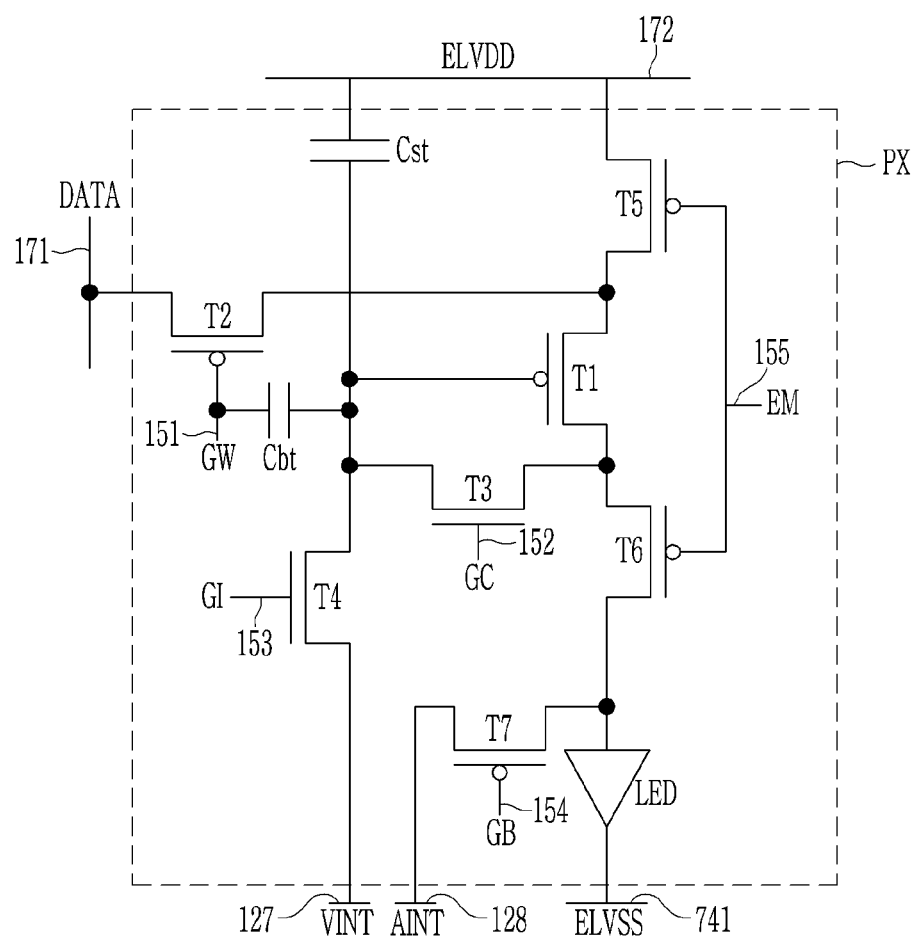
FIG. 7 is a schematic circuit diagram of the display device of FIG. 1 according to an embodiment.

FIG. 7 is a circuit diagram of the display device of FIG. 1 according to some embodiments.

As shown in FIG. 7, one pixel PX of the display device 1000 according to some embodiments includes a plurality of transistors T1, T2, T3, T4, T5, T6, and T7 connected to a plurality of wires 127, 128, 151, 152, 153, 154, 155, 171, 172, and 741, a storage capacitor Cst, a boost capacitor Cbt, and a light emitting diode LED.

One pixel PX is connected to the plurality of wires 127, 128, 151, 152, 153, 154, 155, 171, 172, and 741. The plurality of wires includes a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver, and transmits a first scan signal GW to a second transistor T2. The second scan signal line 152 may be applied with a voltage of a polarity that is opposite to that of a voltage applied to the first scan signal line 151 at the same timing as a signal of the first scan signal line 151. For example, when a negative voltage is applied to the first scan signal line 151, a positive voltage may be applied to the second scan signal line 152. The second scan signal line 152 transmits a second scan signal GC to a third transistor T3.

The initialization control line 153 transmits an initialization control signal GI to a fourth transistor T4. The bypass control line 154 transmits a bypass signal GB to a seventh transistor T7. The bypass control line 154 may be formed with the first scan signal line 151 of a previous stage. The light emission control line 155 transmits a light emission control signal EM to a fifth transistor T5 and a sixth transistor T6.

The data line 171 is a wire that transmits a data voltage DATA generated from a data driver, and luminance of light emitted from a light emitting diode LED is changed according to the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. In some embodiments, the driving voltage line 172, the first and second initialization voltage lines 127 and 128, and the common voltage line 741 may be respectively applied with constant voltages.

Hereinafter, a structure and connection relationship of the plurality of transistors will be described in more detail.

The driving transistor T1 may have a P-type transistor characteristic, and may include a polycrystalline semiconductor. The driving transistor T1 is a transistor that adjusts intensity of a current output to an anode of the light emitting diode LED according to the data voltage DATA applied to a gate electrode of the driving transistor T1. Since brightness of the light emitting diode LED is adjusted according to the intensity of a driving current output to the anode of the light emitting diode LED, luminance of the light emitting diode LED can be adjusted according to the data voltage DATA applied to the pixel PX. For this purpose, a first electrode of the driving transistor T1 is arranged to receive the driving voltage ELVDD, and thus, is connected to the driving voltage line 172 via the fifth transistor T5. In addition, the first electrode of the driving transistor T1 is connected to a second electrode of the second transistor T2, and thus, receives the data voltage DATA. A second electrode of the driving transistor T1 is disposed to be able to output a current toward the light emitting diode LED, and thus, is connected to the anode of the light emitting diode LED via the sixth transistor T6. In addition, the second electrode of the driving transistor T1 transmits the data voltage DATA applied to the first electrode to the third transistor T3. A gate electrode of the driving transistor T1 is connected to one electrode (hereinafter, referred to as a second storage electrode) of the storage capacitor Cst. Thus, a voltage of the gate electrode of the driving transistor T1 is changed according to a voltage stored in the storage capacitor Cst, and accordingly, a driving current output from the driving transistor T1 is changed. In addition, the storage capacitor Cst also serves to maintain the voltage of the driving transistor T1 to be constant during one frame.

The second transistor T2 may have a P-type transistor characteristic, and may include a polycrystalline semiconductor. The second transistor T2 is a transistor that receives a data voltage DATA into the pixel PX. A gate electrode of the second transistor T2 is connected to the first scan signal line 151 and one electrode (hereinafter, referred to as a lower boost electrode) of the boost capacitor Cbt. A first electrode of the second transistor T2 is connected to the data line 171. A second electrode of the second transistor T2 is connected to the first electrode of the driving transistor T1. When the second transistor T2 is turned on by a negative voltage among the first scan signal GW transmitted through the first scan signal line 151, the data voltage DATA transmitted through the data line 171 is transmitted to the first electrode of the driving transistor T1.

The third transistor T3 may have an N-type transistor characteristic, and may include an oxide semiconductor. The third transistor T3 electrically connects the second electrode of the driving transistor T1 and the gate electrode of the driving transistor T1. Thus, third transistor T3 is a transistor that transmits a compensation voltage changed from the data voltage DATA through the driving transistor T1 to a second storage electrode of the storage capacitor Cst. A gate electrode of the third transistor T3 is connected to the second scan signal line 152, and a first electrode of the third transistor T3 is connected to the second electrode of the driving transistor T1. A second electrode of the third transistor T3 is connected to a second storage electrode of the storage capacitor Cst, the gate electrode of the driving transistor T1, and the other electrode (hereinafter, referred to as an upper boost electrode) of the boost capacitor Cbt. The third transistor T3 is turned on by the positive voltage of the second scan signal GC transmitted through the second scan signal line 152, and thus, connects the gate electrode of the driving transistor T1 and the second electrode of the driving transistor T1, and transmits a voltage applied to the gate electrode of the driving transistor T1 to the second storage electrode of the storage capacitor Cst such that the voltage is stored in the storage capacitor Cst.

The fourth transistor T4 may have an N-type transistor characteristic, and may include an oxide semiconductor. The fourth transistor T4 may serve to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second storage electrode of the storage capacitor Cst, the gate electrode of the driving transistor T1, and the upper boost electrode of the boost capacitor Cbt via the second electrode of the third transistor T3. The fourth transistor T4 is turned on by a positive voltage among the initialization control signal GI transmitted through the initialization control line 153, and in this case, the fourth transistor T4 transmits the first initialization voltage VINT to the gate electrode of the driving transistor T1 and the second storage electrode of the storage capacitor Cst. Accordingly, a voltage of the gate electrode of the driving transistor T1 and the storage capacitor Cst are initialized.

The fifth transistor T5 may have a P-type transistor characteristic, and may include a polycrystalline semiconductor. The fifth transistor T5 serves to transmit the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 may have a P-type transistor characteristic, and may include a polycrystalline semiconductor. The sixth transistor T6 serves to transmit a driving current output from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to an anode of the light emitting diode LED.

The seventh transistor T7 may have a P-type transistor characteristic, and may include a polycrystalline semiconductor. The seventh transistor T7 serves to initialize the anode of the light emitting diode LED. A gate electrode of the seventh transistor T7 is connected to the bypass control line 154, a first electrode of the seventh transistor T7 is connected to the anode of the light emitting diode LED, and a second electrode of the seventh transistor T7 is connected to the second initialization voltage line 128. When the seventh transistor T7 is turned on by a negative voltage among the bypass signal GB, the second initialization voltage AINT is applied to the anode of the light emitting diode LED and thus the anode of the light emitting diode LED is initialized.

In the above description, it has been described that one pixel PX includes seven transistors T1 to T7, one storage capacitor Cst, and one boost capacitor Cbt, but embodiments are limited thereto, and the number of transistors, the number of capacitors, and the connection relationship therebetween can be variously modified.

In some embodiments, the driving transistor T1 may include a polycrystalline semiconductor. In addition, the third transistor T3 and the fourth transistor T4 may include an oxide semiconductor. The second transistor T2, the fifth transistor T5, the sixth transistor T6, and the seventh transistor T7 may include a polycrystalline semiconductor. However, this is not restrictive, and at least one of the second transistor T2, the fifth transistor T5, the sixth transistor T6, and the seventh transistor T7 may include an oxide semiconductor. In addition, all the plurality of transistors may include a polycrystalline semiconductor.

Next, referring to FIGS. 8 to 13, a display device according to some embodiments will be described.

A display device 1001 described in association with FIGS. 8 to 13 is almost the same as the display device 1000 described in association with FIGS. 1 to 7, and therefore, a description for the same parts will be omitted. The display device 1001 according to some embodiments is different from the display device 1000 in that the display device 1001 is formed as a tiled display device connected with a plurality of display panels, and this will be described in more detail hereinafter.

Figure 8:
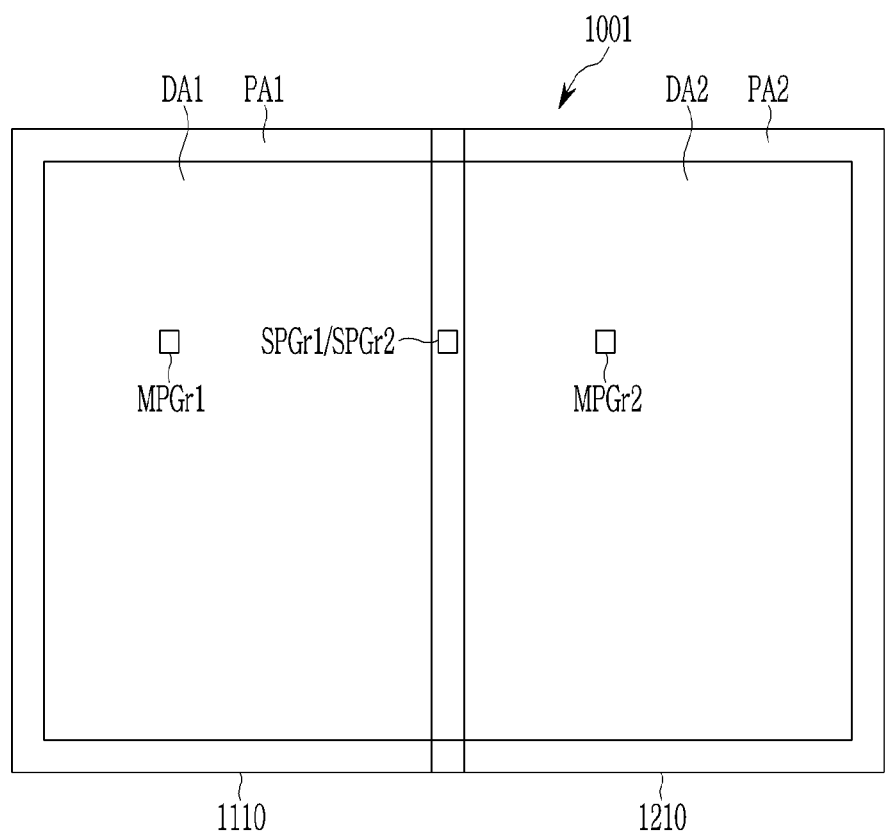
FIG. 8 is a schematic top plan view of a display device according to an embodiment.
Figure 9:
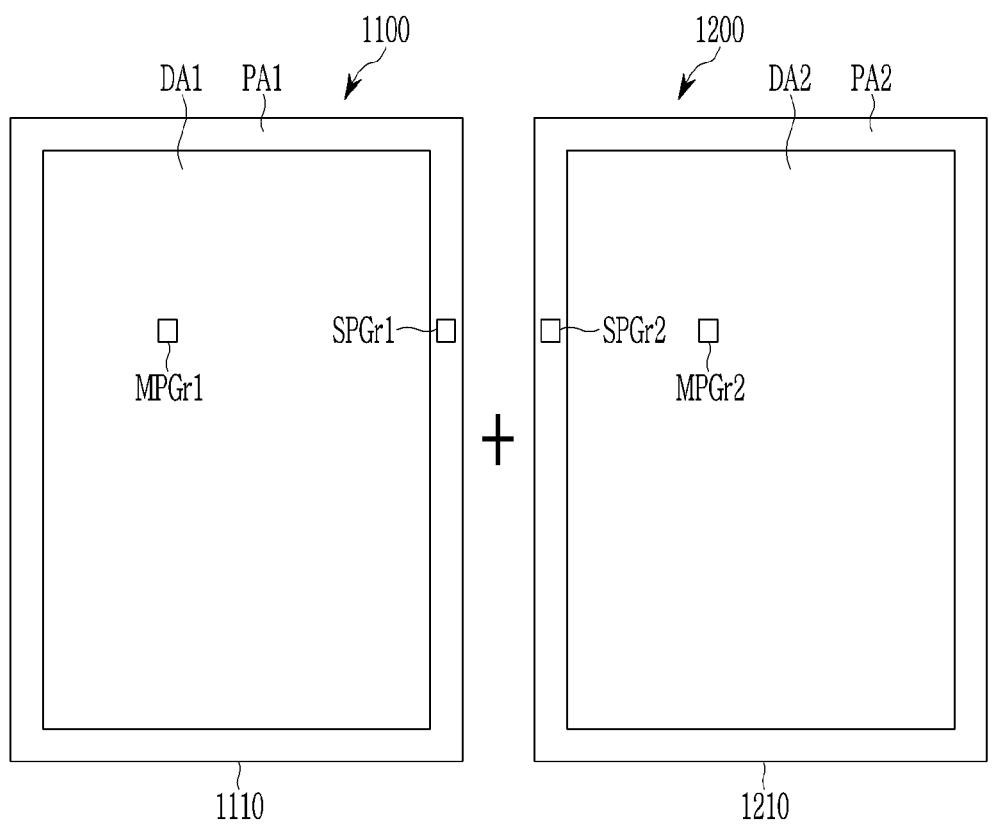
FIG. 9 shows the display device of FIG. 8 in a separated view according to an embodiment.
Figure 10:
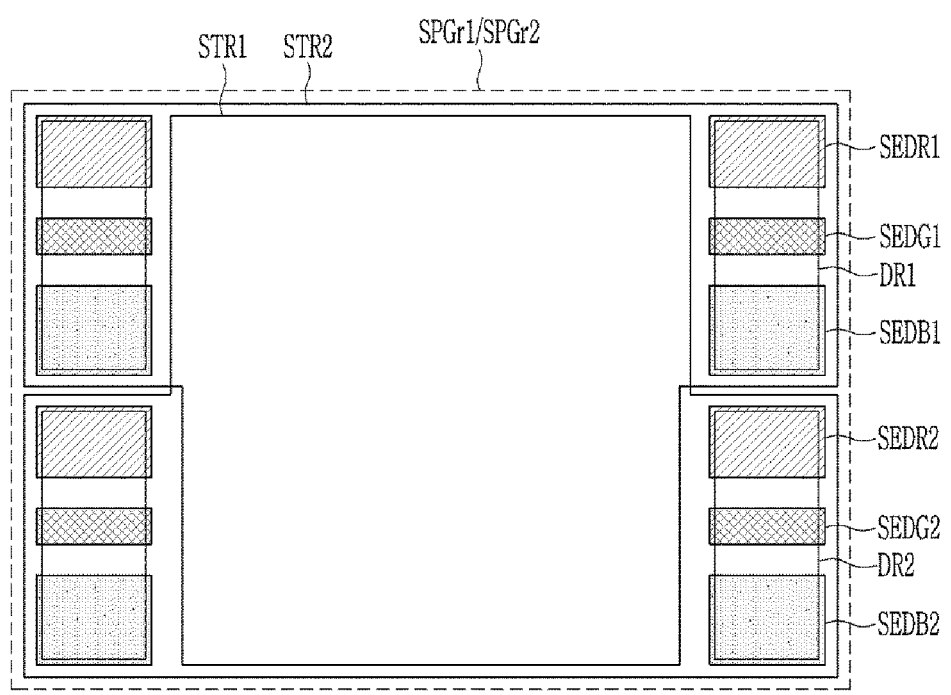
FIG. 10 is a schematic top plan view of a part of the display device of FIG. 8 according to an embodiment.
Figure 11:
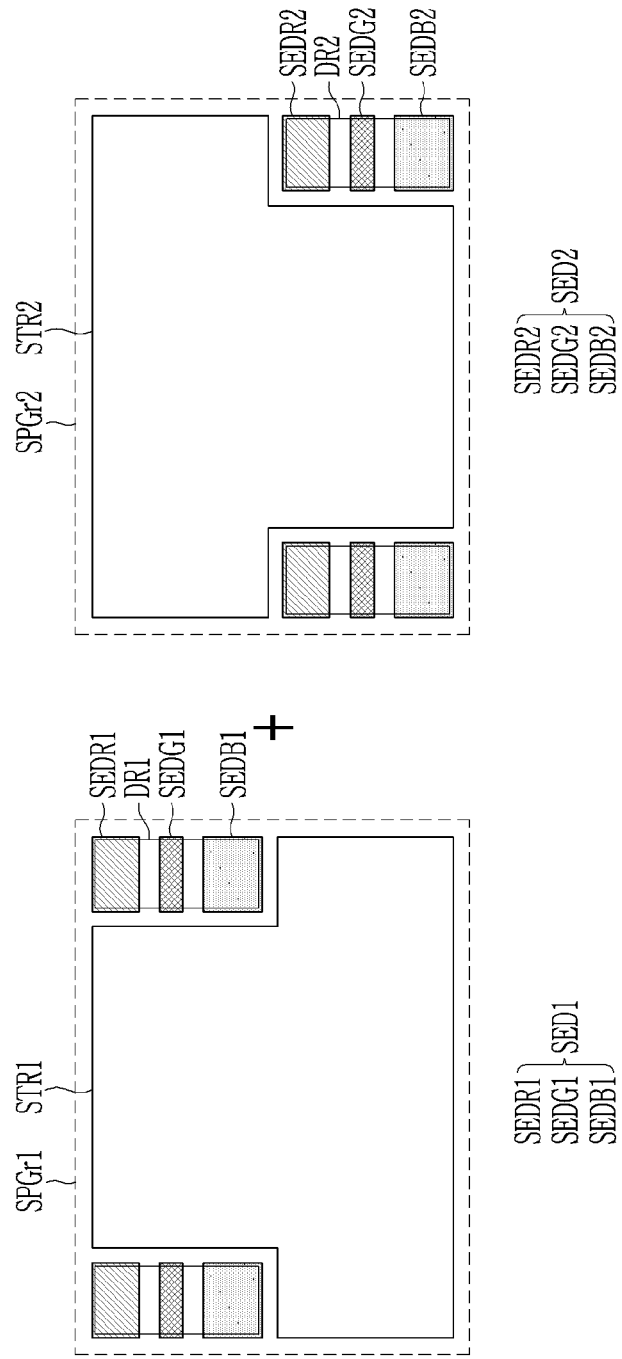
FIG. 11 shows a part separated from the display device of FIG. 8 according to an embodiment.
Figure 12:
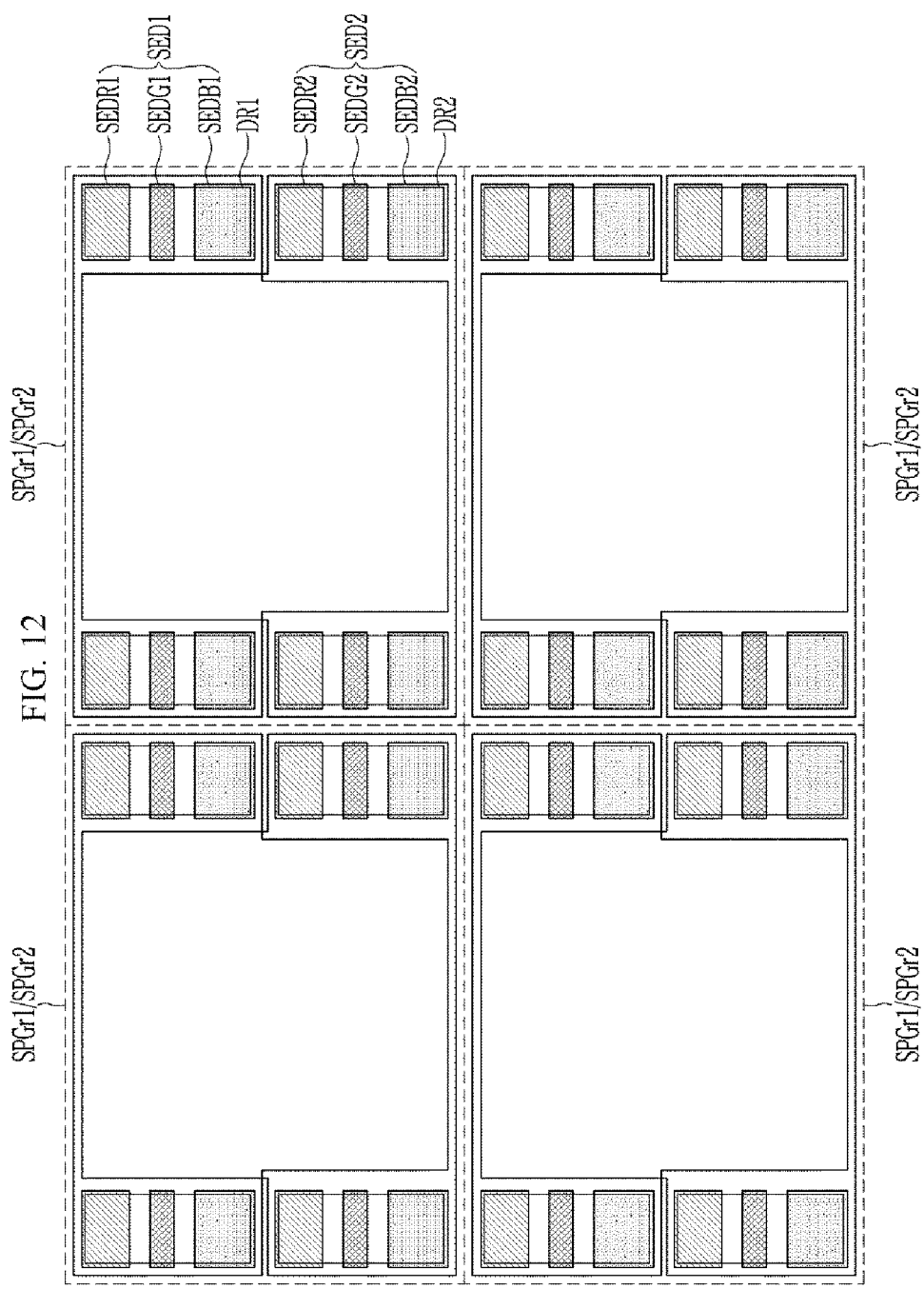
FIG. 12 is a schematic top plan view of the display device of FIG. 8 according to an embodiment.
Figure 13:
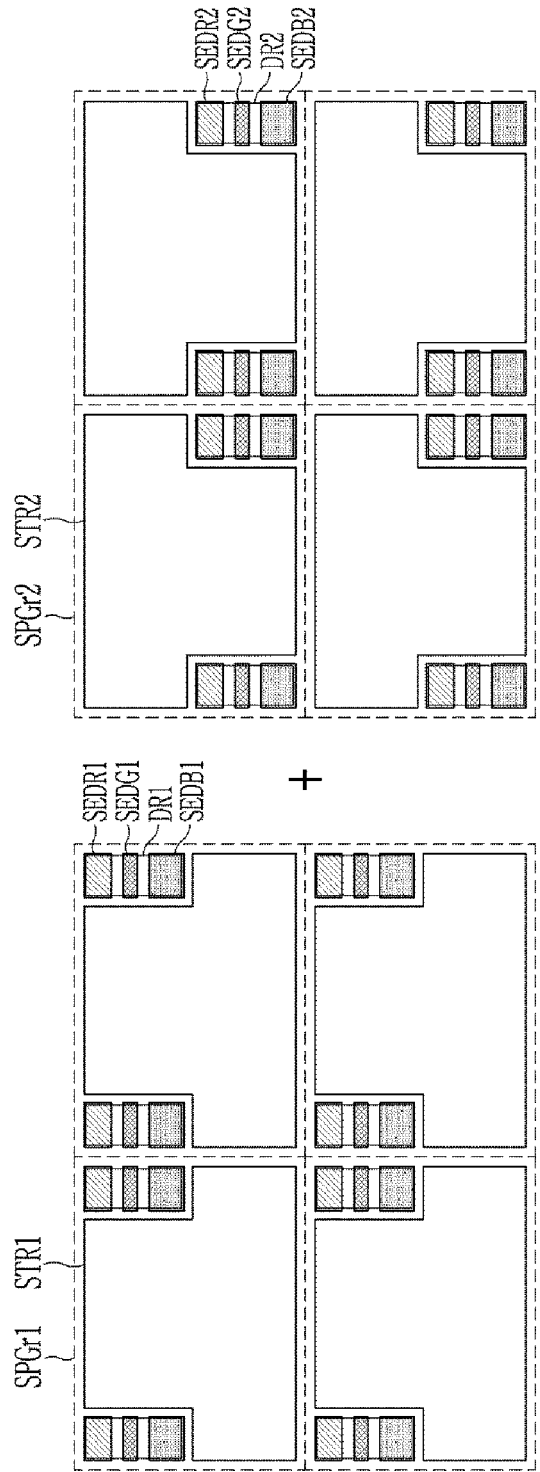
FIG. 13 shows separated parts of the display device of FIG. 8 according to an embodiment.

FIG. 8 is a schematic top plan view of a display device according to an embodiment. FIG. 9 shows the display device in a separated view according to an embodiment. FIG. 10 is a schematic top plan view of a part of the display device of FIG. 8 according to an embodiment. FIG. 11 shows a part separated from the display device of FIG. 8 according to an embodiment. FIG. 12 is a schematic top plan view of the display device of FIG. 8 according to an embodiment. FIG. 13 shows separated parts of the display device of FIG. 8 according to an embodiment.

As shown in FIGS. 8 and 9, a display device 1001 according to an embodiment may include a plurality of display panels 1100 and 1200. The plurality of display panels 1100 and 1200 may include a first display panel 1100 and a second display panel 1200. The first display panel 1100 and the second display panel 1200 may overlap each other (or may share a common area). An edge of the first display panel 1100 and an edge of the second display panel 1200 may overlap each other.

The first display panel 1100 may include a first substrate 1110, a first main pixel group MPGr1, and a first sub-pixel group SPGr1, and the first main pixel group MPGr1 and the first sub-pixel group SPGr1 may be disposed on the first substrate 1110. The first substrate 1110 includes a first main display area DA1 and a first peripheral area PA1 that surrounds the first main display area DA1. In the first main display area DA1, a plurality of first main pixel groups MPGr1 may be arranged along a row direction and a column direction. In the first peripheral area PA1, a plurality of first sub-pixel groups SPGr1 may be arranged in a row direction and a column direction.

The second display panel 1200 may include a second substrate 1210, and a second main pixel group MPGr2 and a second sub-pixel group SPGr2 that are disposed on the second substrate 1210. The second substrate 1210 includes a second main display area DA2 and a second peripheral area PA2 that surrounds the second main display area DA2. In the second main display area DA2, a plurality of second main pixel groups MPGr2 may be arranged along a row direction and a column direction. In the second peripheral area PA2, a plurality of second sub-pixel groups SPGr2 may be arranged along a row direction and a column direction.

The first display panel 1100 and the second display panel 1200 may overlap each other, and in this case, the first peripheral area PA1 of the first display panel 1100 and the second peripheral area PA2 of the second display panel 1200 may partially overlap each other. For example, a first peripheral area PA1 disposed at the right edge of the first display panel 1100 and a second peripheral area PA2 disposed at the left edge of the second display panel 1200 may overlap each other. The first sub-pixel group SPGr1 and the second sub-pixel group SPGr2 may overlap each other in overlapped portions of the first display panel 1100 and the second display panel 1200.

Hereinafter, referring to FIGS. 10 and 11, overlapped forms of the first sub-pixel group SPGr1 and the second sub-pixel group SPGr2 will be described in more detail. FIG. 10 shows an overlapped state of one first sub-pixel group SPGr1 and one second sub-pixel group SPGr2, and FIG. 11 separately illustrates the first sub-pixel group SPGr1 and the second sub-pixel group SPGr2.

As shown in FIGS. 10 and 11, the first sub-pixel group SPGr1 may include a first sub-light emitting diode SED1 and a first sub-transmission region STR1. The first sub-pixel group SPGr1 may include a plurality of first sub-light emitting diodes SED1. For example, the first sub-pixel group SPGr1 may include two red first sub-light emitting diodes SEDR1, two green first sub-light emitting diodes SEDG1, and two blue first sub-light emitting diodes SEDB1. However, the colors displayed by the first sub-light emitting diodes SED1 are not limited to red, green, and blue, and may be variously modified. The plurality of first sub-light emitting diodes SED1 may be disposed at an upper left area and an upper right area of the first sub-pixel group SPGr1. For example, one red first sub-light emitting diode SEDR1, one green first sub-light emitting diode SEDG1, and one blue first sub-light emitting diode SEDB1 may be sequentially disposed in the upper left region of the first sub-pixel group SPGr1. In addition, one red first sub-light emitting diode SEDR1, one green first sub-light emitting diode SEDG1, and one blue first sub-light emitting diode SEDB1 may be sequentially disposed in the upper right region of the first sub-pixel group SPGr1. The first sub-transmission region STR1 may be disposed in a portion that does not overlap the first sub-light emitting diode SED1. The first sub-transmission region STR1 may be disposed in a lower left region, a lower right region, and a center (or central) region.

A first driving circuit DR1 may be disposed in the first peripheral area PA1 of the first display panel 1100. The first driving circuit DR1 may overlap the first sub-light emitting diode SED1. One first sub-pixel group SPGr1 may overlap two first driving circuits DR1. For example, one of the two first driving circuits DR1 may overlap three first sub-light emitting diodes SED1 that are disposed in the upper left area of the first sub-pixel group SPGr1, and the other may overlap three first sub-light emitting diodes SED1 disposed in the upper right area of the first sub-pixel group SPGr1.

The second sub-pixel group SPGr2 may include a second sub-light emitting diode SED2 and a second sub-transmission region STR2. The second sub-pixel group SPGr2 may include a plurality of second sub-light emitting diodes SED2. For example, the second sub-pixel group SPGr2 may include two red second sub-light emitting diodes SEDR2, two green second sub-light emitting diodes SEDG2, and two blue second sub-light emitting diodes SEDB2. However, the colors displayed by the second sub-light emitting diode SED2 are not limited to red, green, and blue, and may be variously modified. The plurality of second sub-light emitting diodes SED2 may be disposed in a lower left region and a lower right region. For example, one red second sub-light emitting diode SEDR2, one green second sub-light emitting diode SEDG2, and one blue second sub-light emitting diode SEDB2 may be sequentially disposed in the lower left region of the second sub-pixel group SPGr2. In addition, in the lower right region of the second sub-pixel group SPGr2, one red second sub-light emitting diode SEDR2, one green second sub-light emitting diode SEDG2, and one blue second sub-light emitting diode SEDB2 may be sequentially positioned. The second sub-transmission region STR2 may be disposed in a region that does not overlap the second sub-light emitting diode SED2. The second sub-transmission region STR2 may be disposed in an upper left region, an upper right region, and a center (or central) region of the second sub-pixel group SPGr2.

The second driving circuit DR2 may be disposed in the second peripheral area PA2 of the second display panel 1200. The second driving circuit DR2 may overlap the second sub-light emitting diodes SED2. One second sub-pixel group SPGr2 may overlap two second driving circuits DR2. For example, one of the two second driving circuits DR2 may overlap three second sub-light emitting diodes SED2 disposed in the lower left region of the second sub-pixel group SPGr2, and the other one may overlap three second sub-light emitting diodes SED2 disposed in the lower right region of the second sub-pixel group SPGr2.

The first sub-pixel group SPGr1 and the second sub-pixel group SPGr2 may completely overlap each other. In this case, the first sub-light emitting diode SED1 of the first sub-pixel group SPGr1 may overlap the second sub-transmission region STR2 of the second sub-pixel group SPGr2. The second sub-light emitting diode SED2 of the second sub-pixel group SPGr2 may overlap the first sub-transmission region STR1 of the first sub-pixel group SPGr1. The first sub-light emitting diodes SED1 of the first sub-pixel group SPGr1 and the second sub-light emitting diodes SED2 of the second sub-pixel group SPGr2 may not overlap each other. A portion where the first sub-transmission region STR1 of the first sub-pixel group SPGr1 and the second sub-transmission region STR2 of the second sub-pixel group SPGr2 overlap each other may be an area where light is substantially transmitted. For instance, the first display panel 1100 and the second display panel 1200 may be transparently recognized by the overlapped portions of the first sub-transmission region STR1 and the second sub-transmission region STR2.

Hereinafter, referring to FIGS. 12 and 13, overlapped forms of the plurality of first sub-pixel groups SPGr1 and the plurality of second sub-pixel groups SPGr2 will be described in more detail. FIG. 12 illustrates overlapped states of four adjacent first sub-pixel groups SPGr1 and four adjacent second sub-pixel groups SPGr2 according to an embodiment. FIG. 13 illustrates four adjacent first sub-pixel groups SPGr1 and four adjacent second sub-pixel groups SPGr2 in a separated view according to an embodiment.

The plurality of first sub-pixel groups SPGr1 may be arranged in a row direction and a column direction, and four first sub-pixel groups SPGr1 of the plurality of first sub-pixel groups SPGr1 may be disposed to be adjacent to each other in the top, bottom, left, and right directions. The plurality of second sub-pixel groups SPGr2 may be arranged in a row direction and a column direction, and four of the plurality of second sub-pixel groups SPGr2 may be disposed adjacent to each other in the top, bottom, left, and right directions. The four first sub-pixel groups SPGr1 and the four second sub-pixel groups SPGr2 may completely overlap each other.

The first sub-light emitting diodes SED1 of the first sub-pixel group SPGr1 may overlap the second sub-transmission region STR2 of the second sub-pixel group SPGr2, and the second sub-light emitting diodes SED2 of the second sub-pixel group SPGr2 may overlap the first sub-transmission region STR1 of the first sub-pixel group SPGr1. Accordingly, light emission may also occur in the overlapped portion of the first display panel 1100 and the second display panel 1200. In addition, the first display panel 1100 and the second display panel 1200 may be transparently recognized by the overlapped portions of the first sub-transmission region STR1 of the first sub-pixel group SPGr1 and the second sub-transmission region STR2 of the second sub-pixel group SPGr2. For instance, the display device 1001 according to some embodiments may emit light while a connection portion of a plurality of display panels of the tiled transparent display device is transparent.

The arrangement of the first sub-light emitting diodes SED1 in the first sub-pixel group SPGr1 and the arrangement of the second sub-light emitting diodes SED2 in the second sub-pixel group SPGr2 can be variously modified. Accordingly, the shapes of the first sub-transmission region STR1 and the second sub-transmission region STR2, and the positions of the first driving circuit DR1 and the second driving circuit DR2 may be variously changed. Hereinafter, referring to FIGS. 14 to 16, various arrangement forms of the first sub-light emitting diode SED1 and the second sub-light emitting diode SED2 will be described in more detail.

Figure 14:
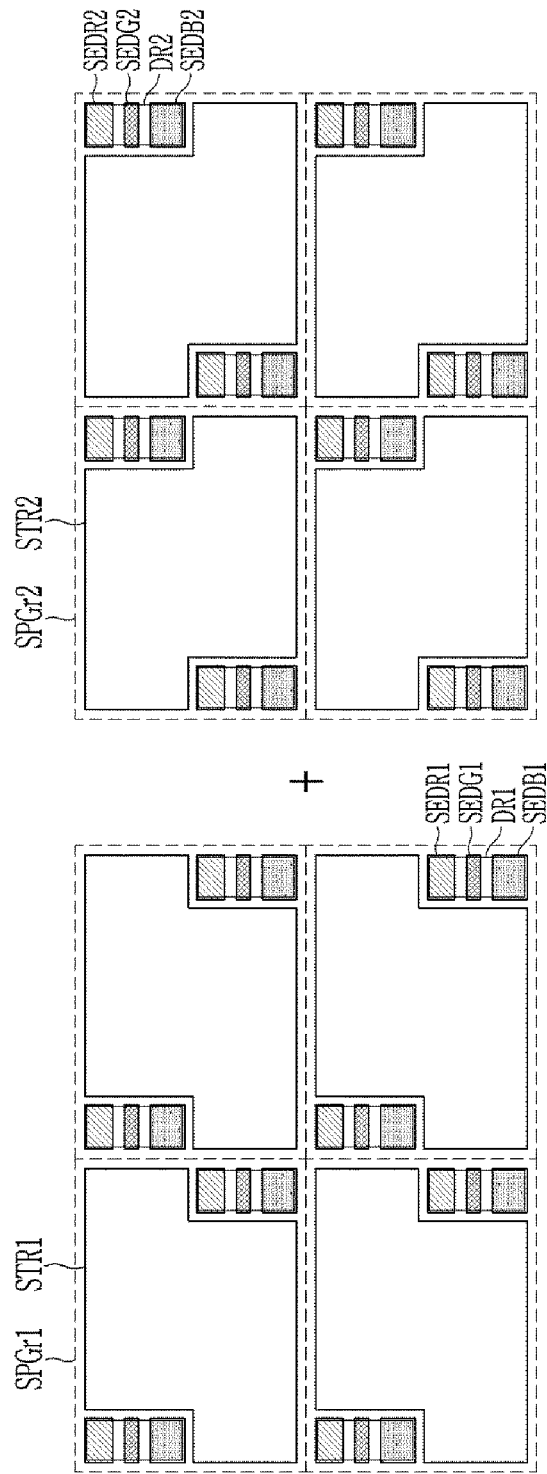
Figure 15:
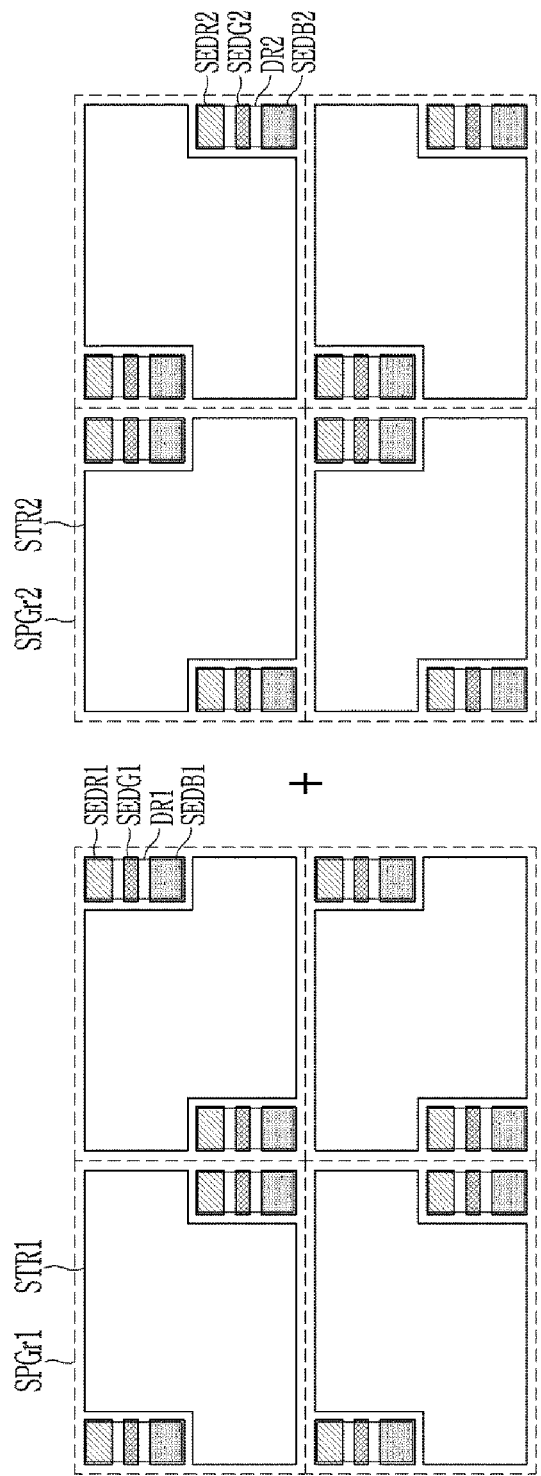

FIGS. 14, 15, and 16 are schematic top plan views of a part of the display device of FIG. 8 according to some embodiments. FIGS. 14 to 16 show different variations.

As shown in FIG. 14, the first sub-pixel group SPGr1 may include the first sub-light emitting diodes SED1 and the first sub-transmission regions STR1. The plurality of first sub-light emitting diodes SED1 may be disposed in the upper left region and the lower right region of the first sub-pixel group SPGr1. The first sub-light emitting diodes SED1 may overlap the first driving circuit DR1. The first sub-transmission regions STR1 may be disposed in the lower left region, the upper right region, and the center (or central) region of the first sub-pixel group SPGr1.

The second sub-pixel group SPGr2 may include the second sub-light emitting diodes SED2 and the second sub-transmission regions STR2. The plurality of second sub-light emitting diodes SED2 may be disposed in the lower left region and the upper right region of the second sub-pixel group SPGr2. The second sub-light emitting diodes SED2 may overlap the second driving circuit DR2. The second sub-transmission regions STR2 may be disposed in the upper left region, the lower right region, and the center (or central) region.

The first sub-pixel group SPGr1 and the second sub-pixel group SPGr2 may completely overlap each other, and the shapes of the first sub-pixel group SPGr1 and the second sub-pixel group SPGr2 are substantially the same as shown in the overlapped shapes in FIG. 12. The first sub-light emitting diodes SED1 of the first sub-pixel group SPGr1 may overlap the second sub-transmission region STR2 of the second sub-pixel group SPGr2, and the second sub-light emitting diodes SED2 of the second sub-pixel group SPGr2 and the first sub-transmission region STR1 of the first sub-pixel group SPGr1 may overlap each other. A portion where the first sub-transmission region STR1 of the first sub-pixel group SPGr1 and the second sub-transmission region STR2 of the second sub-pixel group SPGr2 overlap each other may be an area where light is substantially transmitted.

As shown in FIG. 15, the first sub-pixel group SPGr1 may include the first sub-light emitting diodes SED1 and the first sub-transmission regions STR1. The plurality of first sub-light emitting diodes SED1 may be disposed in the upper left region and the lower right region in some of the first sub-pixel group SPGr1, and the plurality of first sub-light emitting diodes SED1 may be disposed in the lower left region and the upper right region of the first sub-pixel group SPGr1 in some other parts of the first sub-pixel group SPGr1. The first sub-light emitting diode SED1 may overlap the first driving circuit DR1. The first sub-transmission regions STR1 may be disposed in the lower left region, the upper right region, and the center (or central) region of the first sub-pixel group SPGr1 in some of the first sub-pixel group SPGr1, and the first sub-transmission regions STR1 may be disposed in the upper left region, the lower right region, and the center (or central) region of the first sub-pixel group SPGr1 in some other part of the first sub-pixel group SPGr1.

The second sub-pixel group SPGr2 may include the second sub-light emitting diodes SED2 and the second sub-transmission regions STR2. The plurality of second sub-light emitting diodes SED2 may be disposed in the lower left region and the upper right region of the second sub-pixel group SPGr2 in some of the plurality of second sub-pixel groups SPGr2, and the plurality of second sub-light emitting diodes SED2 may be disposed in the left upper region and the lower right region of the second sub-pixel group SPGr2 in some other part of the plurality of second sub-pixel groups SPGr2. The second sub-light emitting diode SED2 may overlap the second driving circuit DR2. The second sub-transmission regions STR2 may be disposed in the upper left region, the lower right region, and the center (or central) region of the second sub-pixel group SPGr2 in some of the plurality of second sub-pixel groups SPGr2, and the second sub-transmission regions STR2 may be disposed in the lower left region, the upper right region, and the center (or central) region of the second sub-pixel group SPGr2 in some of other part of the plurality of second sub-pixel groups SPGr2.

The first sub-pixel group SPGr1 and the second sub-pixel group SPGr2 may completely overlap each other, and the shapes of the first sub-pixel group SPGr1 and the second sub-pixel group SPGr2 are substantially the same as the overlapped shapes shown in FIG. 12. The first sub-light emitting diode SED1 of the first sub-pixel group SPGr1 may overlap the second sub-transmission region STR2 of the second sub-pixel group SPGr2, and the second sub-light emitting diode SED2 of the second sub-pixel group SPGr2 and the first sub-transmission region STR1 of the first sub-pixel group SPGr1 may overlap each other. A portion where the first sub-transmission region STR1 of the first sub-pixel group SPGr1 and the second sub-transmission region STR2 of the second sub-pixel group SPGr2 overlap each other may be an area where light is substantially transmitted.

As shown in FIG. 16, the first sub-pixel group SPGr1 may include the first sub-light emitting diodes SED1 and the first sub-transmission regions STR1. The plurality of first sub-light emitting diodes SED1 may be disposed in the upper left region, the lower left region, the upper right region, and the lower right region of the first sub-pixel group SPGr1. The first sub-light emitting diode SED1 may overlap the first driving circuit DR1. The first sub-transmission regions STR1 may be disposed in the left center (or central) region, the right center (or central) region, and the center (or central) region of the first sub-pixel group SPGr1.

The second sub-pixel group SPGr2 may include the second sub-light emitting diodes SED2 and the second sub-transmission regions STR2. The plurality of second sub-light emitting diodes SED2 may be disposed in the left center (or central) region and the right center (or central) region of the second sub-pixel group SPGr2. The second sub-light emitting diodes SED2 may overlap the second driving circuit DR2. The second sub-transmission regions STR2 may be disposed in the upper left region, the lower left region, the upper right region, the lower right region, and the center (or central) region of the second sub-pixel group SPGr2.

The first sub-pixel group SPGr1 and the second sub-pixel group SPGr2 may completely overlap each other, and the shapes of the first sub-pixel group SPGr1 and the second sub-pixel group SPGr2 in the overlapped shapes shown in FIG. 12. The first sub-light emitting diode SED1 of the first sub-pixel group SPGr1 may overlap the second sub-transmission region STR2 of the second sub-pixel group SPGr2, and the second sub-light emitting diode SED2 of the second sub-pixel group SPGr2 and the first sub-transmission region STR1 of the first sub-pixel group SPGr1 may overlap each other. A portion where the first sub-transmission region STR1 of the first sub-pixel group SPGr1 and the second sub-transmission region STR2 of the second sub-pixel group SPGr2 overlap each other may be an area where light is substantially transmitted.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A transparent display device comprising:
   a substrate comprising a main display area and a peripheral area adjacent to the main display area;
   a main light emitting diode disposed on the substrate and in the main display area;
   a main transmission region disposed in the main display area and adjacent to the main light emitting diode;
   a sub-light emitting diode disposed on the substrate and in the peripheral area;
   a sub-transmission region disposed in the peripheral area and adjacent to the sub-light emitting diode;
   a driving circuit disposed in the peripheral area and overlapping, in a plan view, the sub-light emitting diode,
   a main pixel circuit connected to the main light emitting diode, the main pixel circuit being disposed in the main display area; and
   a sub-pixel circuit connected to the sub-light emitting diode the sub-pixel circuit being disposed in the peripheral area, wherein
   the driving circuit generates and transmits a scan signal to each of the main pixel circuit and the sub-pixel circuit, and wherein
   the main light emitting diode and the sub-light emitting diode are included in a same display panel.

2. The transparent display device of claim 1, further comprising: an extension line connecting the sub-pixel circuit and the sub-light emitting diode, wherein, in the plan view, the extension line does not overlap the sub-transmission region.

3. The transparent display device of claim 2, wherein:
   the sub-light emitting diode comprises an anode, an emission layer, and a cathode sequentially stacked; and
   the extension line extends from the anode.

4. The transparent display device of claim 1, wherein, in the plan view, the driving circuit does not overlap the sub-pixel circuit.

5. The transparent display device of claim 1, wherein, in the plan view, the sub-transmission region does not overlap the sub-light emitting diode, the driving circuit, and the sub-pixel circuit.

6. The transparent display device of claim 1, wherein:
- a plurality of sub-pixel groups are disposed in the peripheral area; and
- each of the plurality of sub-pixel groups comprises a sub-transmission region and a sub-light emitting diode.

7. The transparent display device of claim 6, wherein each of the sub-pixel groups comprises a plurality of sub-light emitting diodes.

8. The transparent display device of claim 7, wherein a size of the sub-transmission region is larger than a size of the plurality of sub-light emitting diodes.

9. The transparent display device of claim 1, wherein the transparent display device is comprised of only one display panel.

10. The transparent display device of claim 1, wherein the main light emitting diode and the sub-light emitting diode are disposed on a same plane in a cross-sectional view.

11. The transparent display device of claim 1, wherein the driving circuit is comprised of:
- a scan driver that generates and transmits scan signals to each of the main pixel circuit and the sub-pixel circuit; and
- a data driver that generates and transmits data signals to each of the main pixel circuit and the sub-pixel circuit.

* * * * *